United States Patent
Lee

(10) Patent No.: US 9,628,056 B1
(45) Date of Patent: Apr. 18, 2017

(54) LATCH CIRCUIT, RECEIVER CIRCUIT, SEMICONDUCTOR APPARATUS AND SYSTEM USING THE LATCH AND RECEIVER CIRCUITS

(71) Applicant: Sk hynix Inc., Icheon-si, Gyeonggi-do (KR)

(72) Inventor: Wan Seob Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/163,219

(22) Filed: May 24, 2016

(30) Foreign Application Priority Data

Feb. 5, 2016 (KR) .......................... 10-2016-0014704

(51) Int. Cl.
| | |
|---|---|
| *H03K 3/00* | (2006.01) |
| *H03K 3/356* | (2006.01) |
| *H03K 5/13* | (2014.01) |
| *G11C 7/10* | (2006.01) |
| *H03K 5/00* | (2006.01) |

(52) U.S. Cl.
CPC .......... *H03K 3/356113* (2013.01); *G11C 7/10* (2013.01); *H03K 5/13* (2013.01); *H03K 2005/00013* (2013.01)

(58) Field of Classification Search
None
See application file for complete search history.

(56) References Cited

U.S. PATENT DOCUMENTS

| | | | |
|---|---|---|---|
| 7,719,321 B2 | 5/2010 | Lee et al. | |
| 8,022,735 B2 * | 9/2011 | Hwang | G11C 8/06 327/108 |
| 8,358,161 B2 * | 1/2013 | Hwang | G11C 8/06 327/172 |
| 2014/0340969 A1 * | 11/2014 | Jung | G11C 7/222 365/189.05 |

FOREIGN PATENT DOCUMENTS

KR 1020050121524 A 12/2005

\* cited by examiner

*Primary Examiner* — Long Nguyen
(74) *Attorney, Agent, or Firm* — William Park & Associates Ltd.

(57) ABSTRACT

A latch circuit, a receiver circuit, a semiconductor apparatus, or a system may be provided. The latch circuit may include a delay configured to delay an input signal and generate a delay signal. The latch circuit may include a control signal generator configured to enable a control signal based on the input signal and the delay signal, and disable the control signal based on a reset signal. The latch circuit may include a gating circuit configured to output, based on the control signal, the input signal and the delay signal to an output node. The latch circuit may include a latch configured to latch, based on a strobe pulse, an output of the gating circuit and generate an output signal.

22 Claims, 5 Drawing Sheets

LATCH CIRCUIT, RECEIVER CIRCUIT, SEMICONDUCTOR APPARATUS AND SYSTEM USING THE LATCH AND RECEIVER CIRCUITS

CROSS-REFERENCES TO RELATED APPLICATION

The present application claims priority under 35 U.S.C. §119(a) to Korean application number 10-2016-0014704, filed on Feb. 5, 2016, in the Korean Intellectual Property Office, which is incorporated herein by reference in its entirety.

BACKGROUND

1. Technical Field

Various embodiments generally relate to a semiconductor apparatus, and more particularly, to a latch circuit, a receiver circuit, and semiconductor apparatus and system using the latch and receiver circuits.

2. Related Art

Electronic products for personal uses, such as a personal computer, a tablet PC, a laptop computer and a smart phone, may be constructed by various electronic components. Two different electronic components in the electronic products may communicate with each other at a high speed to process a large amount of data within a short amount of time. Among the electronic components, semiconductor apparatuses may include a transceiver circuit and a receiver circuit and exchange signals with each other.

The semiconductor apparatuses may be coupled with each other by a signal transmission line such as a bus to exchange signals with each other. As the performance of semiconductor apparatuses improves, a semiconductor apparatus capable of operating at a high speed while reducing power consumption is being developed. Accordingly, the level or amplitude of a signal to be transmitted through the bus is gradually decreasing. Therefore, an improved receiver structure capable of precisely receiving a signal transmitted through a signal transmission line is needed.

SUMMARY

In an embodiment, a latch circuit may be provided. The latch circuit may include a delay configured to delay an input signal and generate a delay signal. The latch circuit may include a control signal generator configured to enable a control signal based on the input signal and the delay signal, and disable the control signal based on a reset signal. The latch circuit may include a gating circuit configured to output, based on the control signal, the input signal and the delay signal to an output node. The latch circuit may include a latch configured to latch, based on a strobe pulse, an output of the gating circuit and generate an output signal.

In an embodiment, a receiver circuit may be provided. The receiver circuit may include an input buffer configured to receive data and generate a data signal. The receiver circuit may include a latch circuit configured to latch, based on a data strobe signal, the data signal and generate an internal data. The latch circuit may include a latch control circuit configured to delay the data signal and generate, from the data signal and a delayed data signal, an extended data signal having a window wider than a window of the data signal. The latch circuit may include a latch configured to latch the extended data signal in synchronization with a strobe pulse generated based on the data strobe signal.

In an embodiment, a receiver circuit may be provided. The receiver circuit may include an input buffer configured to receive serial data and output a plurality of data signals. The receiver circuit may include a plurality of latch circuits configured to latch the plurality of data signal based on a data strobe signal, and output parallel data. Each of the plurality of latch circuits may include a latch control circuit configured to delay an assigned data signal and generate, from the assigned data signal and a delayed data signal, an extended data signal having a window wider than a window of the plurality of data signals. Each of the plurality of latch circuits may include a latch configured to latch the extended data signal in synchronization with a strobe pulse generated based on the data strobe signal, and output the parallel data.

DETAILED DESCRIPTION

Figure 1:
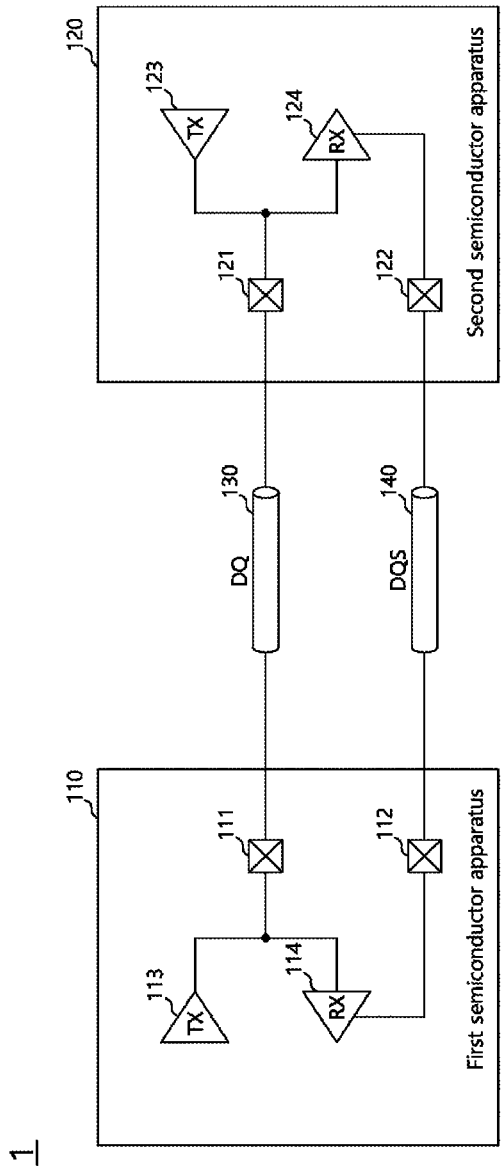
FIG. 1 is a diagram illustrating a representation of an example of the configuration of a system in accordance with an embodiment.

Referring to FIG. 1, a system 1 in accordance with an embodiment may include a first semiconductor apparatus 110 and a second semiconductor apparatus 120. The first semiconductor apparatus 110 and the second semiconductor apparatus 120 may be electronic components that communicate with each other. In an embodiment, the first semiconductor apparatus 110 may be a master apparatus, and the second semiconductor apparatus 120 may be a slave apparatus that is operated under control of the first semiconductor apparatus 110. For example, the first semiconductor apparatus 110 may be a host apparatus such as a processor, and the processor may include a central processing unit (CPU), a graphic processing unit (GPU), a multi-media processor (MMP), and a digital signal processor. Furthermore, the first semiconductor apparatus 110 may be embodied in the form of a System On Chip by combining processor chips such as application processors AP having various functions. The second semiconductor apparatus 120 may be a memory, and the memory may include a volatile memory and a nonvolatile memory. The volatile memory may include an SRAM (static RAM), a DRAM (dynamic RAM), and an SDRAM (synchronous DRAM). The nonvolatile memory may include a ROM (read only memory), a PROM (programmable ROM), an EEPROM (electrically erasable and programmable ROM), an EPROM (electrically programmable ROM), a PRAM (phase change RAM), an MRAM (magnetic RAM), an RRAM (resistive RAM), an FRAM (ferroelectric RAM), and so forth.

The first and second semiconductor apparatuses 110 and 120 may be coupled to each other through a data bus 130 and a strobe bus 140. The first semiconductor apparatus 110 includes pads 111 and 112, and the pad 111 may be coupled with the data bus 130, while the pad 112 may be coupled with the strobe bus 140. The second semiconductor apparatus 120 includes pads 121 and 122, and the pad 121 may be coupled with the data bus 130, while the pad 122 may be coupled with the strobe bus 140. The data bus 130 may be a signal transmission line such as a channel, a link or the like, through which data DQ is transmitted. The strobe bus 140 may be a signal transmission line such as a channel, a link or the like, through which a data strobe signal DQS is transmitted. The first semiconductor apparatus 110 may include a transceiver circuit (TX) 113 and a receiver circuit (RX) 114. The transceiver circuit 113 may transmit data DQ to the second semiconductor apparatus 120 through the data bus 130. The receiver circuit 114 may receive, through the data bus 130, data DQ transmitted from the second semiconductor apparatus 120. The receiver circuit 114 may receive the data DQ using a data strobe signal DQS received through the strobe bus 140. The second semiconductor apparatus 120 may include a transceiver circuit (TX) 123 and a receiver circuit (RX) 124. The transceiver circuit 123 may transmit data DQ to the first semiconductor apparatus 110 through the data bus 130. The receiver circuit 124 may receive, through the data bus 130, data DQ transmitted from the first semiconductor apparatus 110. The receiver circuit 124 may receive the data DQ using a data strobe signal DQS received through the strobe bus 140.

As mentioned above, when transmitting data DQ to the second semiconductor apparatus 120, the first semiconductor apparatus 110 may transmit, along with the data DQ, a data strobe signal DQS synchronized with the data DQ, to notify a time at which the data DQ is transmitted. Likewise, when transmitting data DQ to the first semiconductor apparatus 110, the second semiconductor apparatus 120 may transmit, along with the data DQ, a data strobe signal DQS synchronized with the data DQ. The receiver circuit 114, 124 may latch data DQ synchronized with the data strobe signal DQS and generate an internal signal. In this regard, the receiver circuits 114 and 124 may delay and use the data strobe signal DQS such that the data strobe signal DQS is center-aligned with the data DQ.

The receiver circuits 114 and 124 may receive serial data and generate parallel data. The first and second semiconductor apparatuses 110 and 120 may perform serial data communication, and data DQ which is transmitted through the data bus 130 may be serial data. The receiver circuits 114 and 124 may convert the serial data into the parallel data and generate internal data which can be used in the first and second semiconductor apparatuses 110 and 120.

Figure 2:
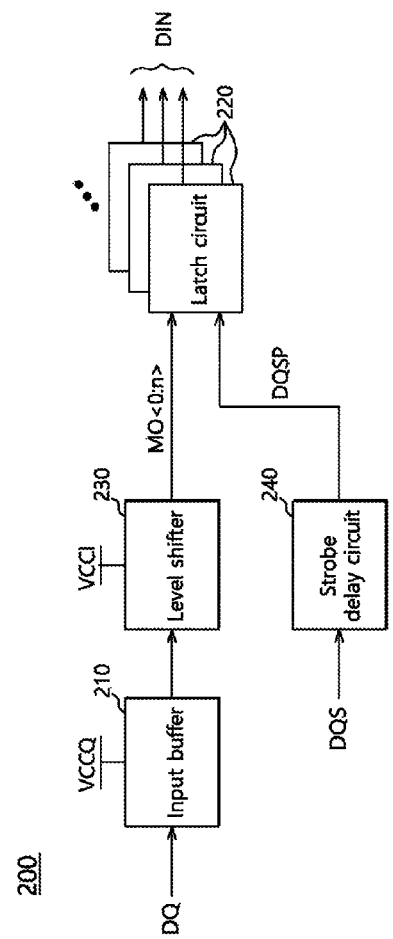
FIG. 2 is a diagram illustrating a representation of an example of the configuration of a receiver circuit in accordance with an embodiment.

FIG. 2 is a diagram illustrating the configuration of a receiver circuit 200 in accordance with an embodiment. Referring to FIG. 2, the receiver circuit 200 may include an input buffer 210 and a plurality of latch circuits 220. The input buffer 210 may receive data DQ from the data bus 130 illustrated in FIG. 1. The data DQ may be serial data. The input buffer 210 may buffer the data DQ and generate data signals MO<0:n>.

The plurality of latch circuits 220 may respectively latch the data signals MO<0:n> and generate internal data DIN. The internal data DIN may be parallel data. The plurality of latch circuits 220 may latch, based on a data strobe signal DQS, the data signals MO<0:n> and generate the internal data DIN. The plurality of latch circuits 220 may successively receive the respective data signals MO<0:n>, and latch the data signals MO<0:n> in synchronization with a strobe pulse DQSP generated based on the data strobe signal DQS. The plurality of latch circuits 220 may respectively receive assigned data signals MO<0:n>. For example, a latch circuit disposed at a first time may receive a first data signal MO<0>, and a latch circuit disposed at a second time may receive a second data signal MO<1>. A latch circuit disposed at a third time may receive a third data signal MO<2>. If the receiver circuit 200 includes four latch circuits, a latch circuit disposed at a fourth time may receive a fourth data signal MO<3>, and the latch circuit disposed at the first time may receive a fifth data signal MO<4>.

The plurality of latch circuits 220 may extend windows or durations of the data signals MO<0:n> and increase a setup and hold margin capable of latching the data signals MO<0:n> with the strobe pulse DQSP. Each of the plurality of latch circuits 220 may delay the received corresponding data signal MO<0:n> and generate an extended data signal from the received data signal MO<0:n> and the delayed data signal. The extended data signal may have a window wider than that of the data signal MO<0:n>. Since each of the plurality of latch circuits 220 latches the extended data signal having a wide window, the latch circuits 220 may more precisely latch signals and generate internal data DIN.

Referring to FIG. 2, the receiver circuit 200 may further include a level shifter 230. The level shifter 230 may change a voltage level of the data signals MO<0:n>. For example, the input buffer 210 may be driven by a first voltage VCCQ, and the level shifter 230 may be driven by a second voltage VCCI. For instance, the input buffer 210 may output a signal which swings between the first voltage VCCQ and a ground voltage, and the level shifter 230 may output a signal which swings between the second voltage VCCI and the ground voltage. The first voltage VCCQ may be an external power voltage, and the second voltage VCCI may be an internal power voltage. The level shifter 230 may shift the voltage level of the data signals MO<0:n> that are driven with the first voltage VCCQ by the input buffer 210, to the second voltage VCCI such that the data signals MO<0:n> are suitable for being used in the semiconductor apparatus including the receiver circuit 200.

Referring to FIG. 2, the receiver circuit 200 may further include a strobe delay circuit 240. The strobe delay circuit 240 may receive a data strobe signal DQS from the strobe bus 140 illustrated in FIG. 1. The strobe delay circuit 240 may delay the data strobe signal DQS and generate the strobe pulse DQSP. The strobe delay circuit 240 may delay the data strobe signal DQS for a first predetermined time and generate the strobe pulse DQSP. The first predetermined time may be a time corresponding to a time delayed while the data DQ passes through paths of the input buffer 210 and the level shifter 230.

Figure 3:
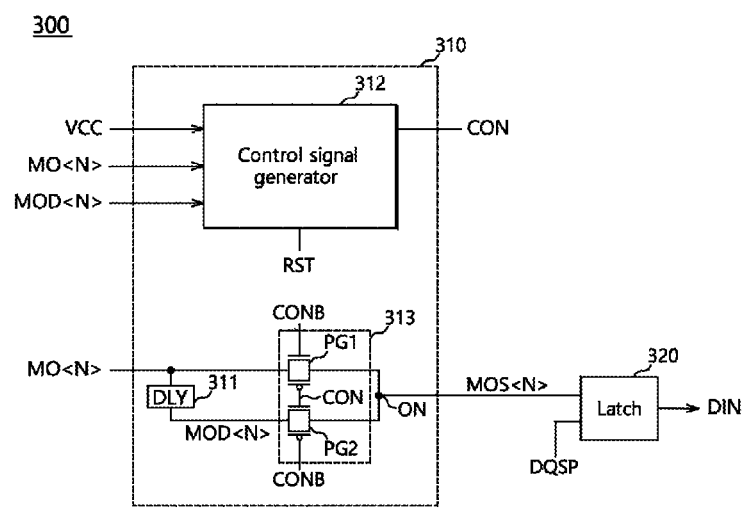
FIG. 3 is a view illustrating a representation of an example of the configuration of a latch circuit illustrated in FIG. 2.

FIG. 3 is a view illustrating the configuration of a latch circuit 220 illustrated in FIG. 2. The plurality of latch circuits 220 illustrated in FIG. 2 may have substantially the same configuration. FIG. 3 may illustrate, among the plurality of latch circuits 220, the configuration of one latch circuit 300 that receives an $N_{th}$ data signal MO<N>. The latch circuit 220 may include a latch control circuit 310 and a latch 320. The latch control circuit 310 may generate an extended data signal MOS<N> based on the data signal MO<N>. The latch control circuit 310 may include a delay 311, a control signal generator 312, and a gating circuit 313. The delay 311 may receive the data signal MO<N> and delay the data signal MO<N>. The delay 311 may delay the data signal MO<N> for a second predetermined time and generate a delayed data signal MOD<N>. The second predetermined time may be arbitrarily set but may be preferably a time or less corresponding to a half of a window or duration of the data signal MO<N>.

The control signal generator 312 may receive the data signal MO<N> and a data signal MOD<N> delayed by the delay 311 and generate a control signal CON. The control signal generator 312 may enable the control signal CON based on the data signal MO<N> and the delayed data signal MOD<N>. The control signal generator 312 may further receive a reset signal RST. The control signal generator 312 may disable the control signal CON based on the reset signal RST. The reset signal RST may be a signal that can be generated based on the data strobe signal DQS. The control signal generator 312 may generate the control signal CON using a power supply voltage VCC. The power supply voltage VCC may be the first voltage VCCQ or the second voltage VCCI.

The gating circuit 313 may output, based on the control signal CON, the data signal MO<N> and the delayed data signal MOD<N> to an output node ON. An extended data signal MOS<N> may be generated from the output node ON. Since the gating circuit 313 may provide, based on the control signal CON, the data signal MO<N> and the delayed data signal MOD<N>, the gating circuit 313 may generate the extended data signal MOS<N> that is extended in a window or duration from a time at which the window of the data signal MO<N> is started to a time at which the window of the delayed data signal MOD<N> is ended.

The gating circuit 313 may include a first pass gate PG1 and a second pass gate PG2. The first pass gate PG1 may receive the control signal CON and a reverse signal CONB of the control signal and provide the data signal MO<N> to the output node ON. The first pass gate PG1 may provide, when the control signal CON is a second level, the data signal MO<N> to the output node ON. The second pass gate PG2 may receive the control signal CON and a reverse signal CONB of the control signal and provide the delayed data signal MOD<N> to the output node ON. The second pass gate PG2 may provide, when the control signal CON is a first level, the delayed data signal MOD<N> to the output node ON. The first level may be, for example, a logic high level, and the second level may be, for example, a logic low level.

The latch 320 may receive the extended data signal MOS<N> and the strobe pulse DQSP. The latch 320 may latch the level of the extended data signal MOS<N> in synchronization with the strobe pulse DQSP. The latch 320 may latch the level of the extended data signal MOS<N> at a rising edge of the strobe pulse DQSP and output the latched signal as the internal data DIN. Because the latch 320 latches the extended data signal MOS<N> having a window wider than that of the data signal MO<N>, the latch 320 may have a larger setup and hold margin.

Figure 4:
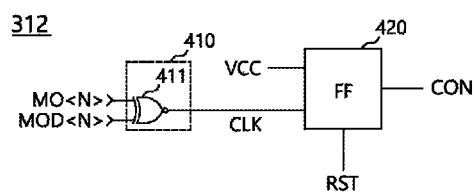
FIG. 4 is a view illustrating a representation of an example of the configuration of a control signal generator illustrated in FIG. 3.

FIG. 4 is a view illustrating the configuration of the control signal generator 312 illustrated in FIG. 3. Referring to FIG. 4, the control signal generator 312 may include a clock generator 410 and a flip-flop 420. The clock generator 410 may generate a clock signal CLK based on the data signal MO<N> and the delayed data signal MOD<N>. The clock generator 410 may enable the clock signal CLK when the data signal MO<N> and the delayed data signal MOD<N> have the same level. The clock generator 410 may include a logic gate or logic gates, for example, an XNOR gate 411. The XNOR gate 411 may receive the data signal MO<N> and the delayed data signal MOD<N> and output the clock signal CLK. The XNOR gate 411 may enable the clock signal CLK in a period in which the window of the data signal MO<N> and the window of the delayed data signal MOD<N> overlap each other.

The flip-flop 420 may receive the clock signal CLK, the power supply voltage VCC and the reset signal RST, and output the control signal CON. The flip-flop 420 may output, when the clock signal CLK is enabled, the second voltage VCCI as the control signal CON. Therefore, the flip-flop 420 may enable, when the clock signal CLK is enabled, the control signal CON to the second voltage level. The flip-flop 420 may disable the control signal CON based on the reset signal RST. The flip-flop 420 may disable the control signal CON to a low level when the reset signal RST is a low level. As described above, the reset signal RST may be generated based on the data strobe signal DQS. The reset signal RST may be generated by delaying the data strobe signal DQS, and the pulse of the reset signal RST may be generated to cover the window of the extended data signal MOS<N>.

Figure 5:
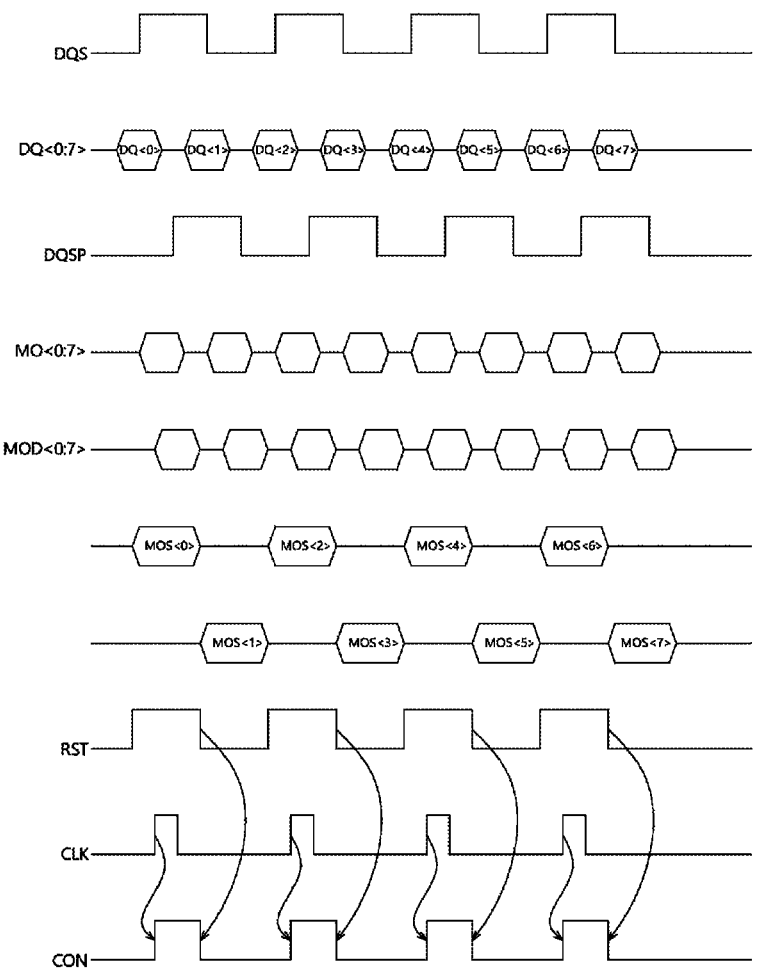
FIG. 5 is a diagram illustrating a representation of an example of the operation of a receiver circuit in accordance with an embodiment.

FIG. 5 is a timing diagram illustrating a representation of an example of the operation of the receiver circuit 200 in accordance with an embodiment. The operation of the receiver circuit 200 in accordance with an embodiment will be described with reference to FIGS. 2 to 5. FIG. 5 illustrates an example of an operation in which the receiver circuit 200 receives eight pieces of data DQ<0:7>. The receiver circuit 200 may receive data DQ<0:7> and a data strobe signal DQS synchronized with the data DQ<0:7>. The data DQ<0: 7> may be inputted in synchronization with edges of the data strobe signal DQS, and the data DQ<0:7> and the data strobe signal DQS may be center-aligned with each other. A first data DQ<0> may be inputted in synchronization with a first rising edge of the data strobe signal DQS, and a second data DQ<1> may be inputted in synchronization with a first falling edge of the data strobe signal DQS. A third data DQ<2> may be inputted in synchronization with a second rising edge of the data strobe signal DQS, and a fourth data DQ<3> may be inputted in synchronization with a second falling edge of the data strobe signal DQS. Likewise, fifth to eighth data DQ<4:7> may be respectively inputted in synchronization with third and fourth rising edges and falling edges of the data strobe signal DQS.

The plurality of latch circuits 220 may be divided into even-numbered latch circuits that receive even-numbered data signals MO<0>, MO<2>, MO<4> and MO<6> generated based on data DQ<0>, DQ<2>, DQ<4> and DQ<6> inputted at even-numbered times, and odd-numbered latch circuits that receive odd-numbered data signals MO<1>, MO<3>, MO<5> and MO<7> generated based on data DQ<1>, DQ<3>, DQ<5> and DQ<7> inputted at odd-numbered times.

The strobe delay circuit 240 may delay the data strobe signal DQS for a first predetermined time and generate the strobe pulse DQSP. The delay 311 may delay the data signal MO<0:7> and generate the delayed data signal MOD<0:7>. The clock generator 410 may generate the clock signal CLK which is enabled in a period in which the windows of the data signal MO<0:7> and the delayed data signal MOD<0: 7> overlap each other. When the clock signal CLK is enabled, the control signal CON may be enabled. The control signal CON may be disabled in synchronization with a falling edge of the reset signal RST. Referring to FIG. 5, illustrated is the clock signal CLK and the control signal CON that are generated by the even-numbered latch circuits. The first pass gate PG1 may output, when the control signal CON is disabled to the second level, the data signal MO<0: 7> to the output node ON. The second pass gate PG2 may output, when the control signal CON is enabled to the first level, the delayed data signal MOD<0:7> to the output node ON. Therefore, the extended data signal MOS<0:7> may have a window extending from a time at which the window of the data signal MO<0:7> is started, to a time at which the window of the delayed data signal MOD<0:7> is ended.

The latch 320 may latch the extended data signal MOS<0:7> in synchronization with a rising edge of the strobe pulse DQSP. Since the extended data signal MOS<0:7> has a window wider than that of the data signal MO<0:7>, the latch 320 can reliably and precisely latch the extended data signal MOS<0:7> and generate the internal data DIN<0:7>.

Figure 6:
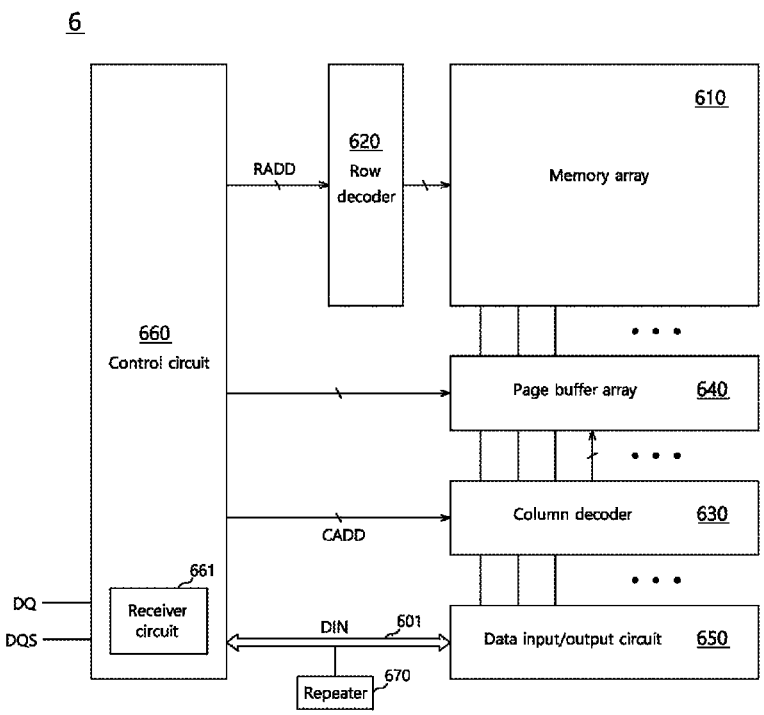
FIG. 6 is a diagram illustrating a representation of an example of the configuration of a semiconductor apparatus in accordance with an embodiment.

FIG. 6 is a diagram illustrating a representation of an example of the configuration of a semiconductor apparatus 6 in accordance with an embodiment. Referring to FIG. 6, the semiconductor apparatus 6 may include a memory array 610, a row decoder 620, a column decoder 630, a page buffer array 640, a data input/output circuit 650 and a control circuit 660. The memory array 610 may include a plurality of cell strings, and a plurality of word lines and a plurality of bit lines that are coupled with the plurality of cell strings. The row decoder 620 may select, based on a row address signal RADD, a word line coupled with a certain memory cell. The column decoder 630 may select, based on a column address signal CADD, a bit line coupled with a certain memory cell. The page buffer array 640 may store data in a memory cell accessed by the row decoder 620 and the column decoder 630 or output data stored in the memory cell.

The data input/output circuit 650 may provide data inputted through a data transmission line 601, to the page buffer array 640, or output data outputted from the page buffer array 640, to the data transmission line 601. The data input/output circuit 650 may receive and amplify data outputted from the page buffer array 640 and output the amplified data to the data transmission line 601. The data input/output circuit 650 may amplify data transmitted through the data transmission line 601 and provide it to the page buffer array 640. Data provided to the page buffer array 640 may be stored in the memory array 610.

The control circuit 660 may control the row decoder 620, the column decoder 630, the page buffer array 640 and the data input/output circuit 650. The control circuit 660 may include various circuits and or logic circuits. Although not limited, the control circuit 660 may include, for example, a voltage supply circuit, a peripheral circuit, an initialization circuit, etc. The voltage supply circuit may generate and supply various voltages to be used in the semiconductor apparatus 6. For example, the voltage supply circuit may generate a read voltage, a program voltage, an erase voltage, and a word line voltage, and generate an internal voltage that is power for operating an internal circuit of the semiconductor apparatus 6. The voltage supply circuit may receive one or more external voltages from the outside of the semiconductor apparatus 6 and generate various voltages.

The peripheral circuit may include various logic circuits for controlling the semiconductor apparatus 6. For instance, the peripheral circuit may include a data buffer, an address buffer, a chip enable unit, and so forth. The initialization circuit may initialize the semiconductor apparatus 6 when power is applied to the semiconductor apparatus 6. The initialization circuit may sense the level of the power and generate an initialization signal.

The control circuit 660 may include a receiver circuit 661 that receives data DQ and a data strobe signal DQS that are transmitted from an external apparatus. The receiver circuit 661 may latch the data DQ based on the data strobe signal DQS, and transmit the latched data to the data transmission line 601. The data transmission line 601 may transmit data outputted from the control circuit 660, to the data input/output line 601, or transmit data outputted from the data input/output circuit 650, to the control circuit 660. The data transmission line 601 may be coupled with a repeater 670 to maintain the strength of a signal transmitted through the data transmission line 601. The repeater 670 may redrive data DIN transmitted through the data transmission line 601. The latch circuit 220 illustrated in FIGS. 2 to 4 may be used as the repeater 670. The repeater 670 may precisely redrive data DIN transmitted through the data transmission line 601 and enhance the operating performance of the semiconductor apparatus 6.

While certain embodiments have been described above, it will be understood to those skilled in the art that the embodiments described are by way of example only. Accordingly, the latch circuit, the receiver circuit, and the semiconductor apparatus and system described herein should not be limited based on the described embodiments. Rather, the latch circuit, the receiver circuit, and the semiconductor apparatus and system described herein should only be limited in light of the claims that follow when taken in conjunction with the above description and accompanying drawings.

What is claimed is:

1. A latch circuit comprising:
   a delay configured to delay an input signal and generate a delay signal;
   a control signal generator configured to enable a control signal based on the input signal and the delay signal, and disable the control signal based on a reset signal;
   a gating circuit configured to output, based on the control signal, the input signal and the delay signal to an output node; and
   a latch configured to latch, based on a strobe pulse, an output of the gating circuit and generate an output signal.

2. The latch circuit according to claim 1, wherein the control signal generator comprises:
   a clock generator configured to generate a clock signal based on the input signal and the delay signal; and
   a flip-flop configured to output, when the clock signal is enabled, a power supply voltage as the control signal, and disable the control signal in response to the reset signal.

3. The latch circuit according to claim 2, wherein the clock generator enables the clock signal when the input signal and the delay signal have the same level.

4. The latch circuit according to claim 1, wherein the gating circuit comprises:
   a first pass gate configured to output, when the control signal is a second level, the input signal to the output node; and
   a second pass gate configured to output, when the control signal is a first level, the delay signal to the output node.

5. The latch circuit according to claim 1, wherein the delay is configured to delay the input signal by a predetermined time less than or equal to a half of a duration of the input signal.

6. The latch circuit according to claim 1, wherein the gating circuit may generate the output of the gating circuit that is extended in a duration from a time at which a window of the input signal is started to a time at which a window of the delay signal is ended.

7. A receiver circuit comprising:
   an input buffer configured to receive data and generate a data signal; and a latch circuit configured to latch, based on a data strobe signal, the data signal and generate an internal data,
wherein the latch circuit comprises:
a latch control circuit configured to delay the data signal and generate, from the data signal and a delayed data signal, an extended data signal having a window wider than a window of the data signal; and
a latch configured to latch the extended data signal in synchronization with a strobe pulse generated based on the data strobe signal.

8. The receiver circuit according to claim 7, further comprising:
a level shifter configured to shift a level of the data signal, wherein the input buffer is driven by a first voltage, and the level shifter is driven by a second voltage.

9. The receiver circuit according to claim 8, wherein the first voltage is an external power supply voltage, and the second voltage is an internal power supply voltage.

10. The receiver circuit according to claim 7, wherein the latch control circuit comprises:
a delay configured to delay the data signal and output the delayed data signal;
a control signal generator configured to generate a control signal based on the data signal and the delayed data signal; and
a gating circuit configured to provide, in response to the control signal, the data signal and the delayed data signal to an output node and generate the extended data signal.

11. The receiver circuit according to claim 10, wherein the control signal generator enables the control signal based on the data signal and the delayed data signal, and disables the control signal based on a reset signal.

12. The receiver circuit according to claim 10, wherein the control signal generator comprises:
a clock generator configured to generate a clock signal based on the data signal and the delayed data signal; and
a flip-flop configured to output, when the clock signal is enabled, a power supply voltage as the control signal, and disable the control signal in response to a reset signal.

13. The receiver circuit according to claim 12, wherein the clock generator enables the clock signal when the data signal and the delayed data signal have the same level.

14. The receiver circuit according to claim 10, wherein the gating circuit comprises:
a first pass gate configured to provide, when the control signal is a second level, the data signal to the output node; and
a second pass gate configured to provide, when the control signal is a first level, the delayed data signal to the output node.

15. A receiver circuit comprising:
an input buffer configured to receive serial data and output a plurality of data signals;
a plurality of latch circuits configured to latch the plurality of data signal based on a data strobe signal, and output parallel data;
wherein each of the plurality of latch circuits comprises:
a latch control circuit configured to delay an assigned data signal and generate, from the assigned data signal and a delayed data signal, an extended data signal having a window wider than a window of the plurality of data signals; and
a latch configured to latch the extended data signal in synchronization with a strobe pulse generated based on the data strobe signal, and output the parallel data.

16. The receiver circuit according to claim 15, further comprising:
a level shifter configured to shift a level of the plurality of data signals,
wherein the input buffer is driven by a first voltage, and the level shifter is driven by a second voltage.

17. The receiver circuit according to claim 16, wherein the first voltage is an external power supply voltage, and the second voltage is an internal power supply voltage.

18. The receiver circuit according to claim 15, wherein the latch control circuit comprises:
a delay configured to delay the assigned data signal;
a control signal generator configured to generate a control signal based on the assigned data signal and the delayed data signal; and
a gating circuit configured to provide, in response to the control signal, the assigned data signal and the delayed data signal to an output node and generate the extended data signal.

19. The receiver circuit according to claim 18, wherein the control signal generator enables the control signal based on the assigned data signal and the delayed data signal, and disables the control signal based on a reset signal.

20. The receiver circuit according to claim 18, wherein the control signal generator comprises:
a clock generator configured to generate a clock signal based on the assigned data signal and the delayed data signal; and
a flip-flop configured to output, when the clock signal is enabled, a power supply voltage as the control signal, and disable the control signal in response to a reset signal.

21. The receiver circuit according to claim 20, wherein the clock generator enables the clock signal when the assigned data signal and the delayed data signal have the same level.

22. The receiver circuit according to claim 18, wherein the gating circuit comprises:
a first pass gate configured to provide, when the control signal is a second level, the data signal to the output node; and
a second pass gate configured to provide, when the control signal is a first level, the delayed data signal to the output node.

* * * * *